US007197268B2

(12) United States Patent
Verheijen

(10) Patent No.: US 7,197,268 B2
(45) Date of Patent: Mar. 27, 2007

(54) CURRENT MEASUREMENT CIRCUIT FOR TRANSFORMER WITH HIGH FREQUENCY OUTPUT

(75) Inventor: Hendrikus Adrianus Anthonius Verheijen, Helden (NL)

(73) Assignee: Xerox Corporation, Stamford, CT (US)

( * ) Notice: Subject to any disclaimer, the term of this patent is extended or adjusted under 35 U.S.C. 154(b) by 116 days.

(21) Appl. No.: 11/174,119

(22) Filed: Jul. 1, 2005

(65) Prior Publication Data

US 2007/0003305 A1 Jan. 4, 2007

(51) Int. Cl.
*G03G 15/08* (2006.01)
*G01R 27/08* (2006.01)

(52) U.S. Cl. ...................................... 399/291; 324/705

(58) Field of Classification Search ................ 399/291; 324/679, 705

See application file for complete search history.

(56) References Cited

U.S. PATENT DOCUMENTS 3,644,806 A * 2/1972 Belson et al. .................. 318/7
4,409,600 A * 10/1983 Minowa ..................... 347/211

* cited by examiner

*Primary Examiner*—Vincent Q. Nguyen
(74) *Attorney, Agent, or Firm*—Maginot, Moore & Beck

(57) ABSTRACT

A printer apparatus includes a photoreceptor, a magnetic roll, an electrode, a current source coupled to the electrode, the current source having a signal generator coupled to an input winding of a transformer that exhibits a parasitic capacitance; and a current measurement circuit. The current measurement circuit includes a simulation capacitor having a capacitance proportional to the parasitic capacitance, the simulation capacitor having a first electrode coupled to a hot terminal of the output winding of the transformer and a second electrode coupled to a first node, a second sense resistor coupled between the first node and ground so current flowing through the simulation capacitor flows through the second sense resistor, a first sense resistor coupled to a second node, and a differential amplifier having an inverting input coupled to the first node and a non-inverting input coupled to the second node.

7 Claims, 7 Drawing Sheets

CURRENT MEASUREMENT CIRCUIT FOR TRANSFORMER WITH HIGH FREQUENCY OUTPUT

BACKGROUND AND SUMMARY

This disclosure relates to circuits for measuring the output current of a transformer and more particularly to circuits that provide an accurate measurement of the output current of a transformer that generates a high voltage, high frequency output signal that at least occasionally has a low output current.

In the process of electrophotographic printing, a charge-retentive surface, also known as a photoreceptor, is charged to a substantially uniform potential, so as to sensitize the surface of the photoreceptor. The charged portion of the photoconductive surface is exposed to a light image of an original document being reproduced, or else a scanned laser image created by the action of digital image data acting on a laser source. The scanning or exposing step records an electrostatic latent image on the photoreceptor corresponding to the informational areas in the document to be printed or copied. After the latent image is recorded on the photoreceptor, the latent image is developed by causing toner particles to adhere electrostatically to the charged areas forming the latent image. This developed image on the photoreceptor is subsequently transferred to a sheet on which the desired image is to be printed. Finally, the toner on the sheet is heated to permanently fuse the toner image to the sheet.

One familiar type of development of an electrostatic image is called "two-component development". Two-component developer material largely comprises toner particles interspersed with carrier particles. The carrier particles are magnetically attractable, and the toner particles are caused to adhere triboelectrically to the carrier particles. This two-component developer can be conveyed, by means such as a "magnetic roll," to the electrostatic latent image, where toner particles become detached from the carrier particles and adhere to the electrostatic latent image.

In magnetic roll development systems, the carrier particles with the triboelectrically adhered toner particles are transported by the magnetic rolls through a development zone. The development zone is the area between the outside surface of a magnetic roll and the photoreceptor surface on which a latent image has been formed. Because the carrier particles are attracted to the magnetic roll, some of the toner particles are interposed between a carrier particle and the latent image on the photoreceptor. These toner particles are attracted to the latent image and transfer from the carrier particles to the latent image. The carrier particles are removed from the development zone as they continue to follow the rotating surface of the magnetic roll. The carrier particles then fall from the magnetic roll and return to the developer supply where they attract more toner particles and are reused in the development process. The carrier particles fall from the magnetic roll under the effects of gravity or a magnetic field that repulses the carrier particles.

Different types of carrier particles have been used in efforts to improve the development of toner from two-component developer with magnetic roll development systems. One type of carrier particle is a very insulated carrier and development systems using developer having these carrier particles increase development efficiency through low magnetic field agitation in the development zone along with close spacing to the latent image and elongation of the development zone. The magnetic field agitation helps prevent electric field collapse caused by toner countercharge in the development zone.

The close spacing increases the effective electric field for a potential difference and the longer development zone provides more time for toner development. Other two-component developers have used permanently magnetized carrier particles because these carrier particles dissipate toner countercharge more quickly by enabling a very dynamic mixing region to form on the magnetic roll.

Another type of carrier particle used in two-component developers is the semiconductive carrier particle. Developers using this type of carrier particle are capable of being used in magnetic roll systems that produce toner bearing substrates at speeds of up to approximately 100 pages per minute (ppm). Developers having semiconductive carrier particles produce a relatively thin layer of developer on the magnetic roll in the development zone. Consequently, magnetic rolls used with semiconductive carrier particles rotate in the same direction as the photoreceptor. That is, rotation of the magnetic roll in the direction opposed to the rotation of the photoreceptor has been observed to be unable to supply an adequate amount of developer for solid halftones and other images.

Many known magnetic roll systems used with developers having semiconductive carrier particles use two magnetic rolls. The two rolls are placed close together with their centers aligned to form a line that is parallel to the photoreceptor. Because the developer layer for semiconductive carrier particle developer is so thin, magnetic fields sufficient to migrate semiconductive carrier particles in adequate quantities from one magnetic roll to the other magnetic roll also interfere with the transfer of toner from the carrier particles carried by the magnetic rolls.

Typically, the carrier and toner particles are freed from the magnetic rolls to form a toner cloud adjacent the photoreceptor. Pairs of wires are often placed in the region between the magnetic rolls and the photoreceptor so that magnetic fields can be generated to cause the toner and carrier particles to be released from the magnetic rolls. These wires are typically supplied by a high voltage power supply in order to generate the necessary magnetic fields. Monitoring of the current supplied by the power supply is often utilized to control the fields generated by the wires. Unfortunately, current circuits and methods of monitoring the output of a high voltage power supply are often ineffective or inaccurate when the high voltage power supply creates a signal with high frequency components and an occasional low current output.

In the prior art, as shown, for example, in FIGS. 7 and 8, the output current of a high voltage transformer 102 is measured by means of a sense resistor 110 in the transformer high voltage winding 108 at the ground side 112 of this winding 108. Using this method, it is assumed that the voltage on the sense resistor 110, referenced to ground 116 is proportional with the output current. For low frequency waveforms this circuitry and method of measuring current work well but if the waveform consists of higher frequencies and the output current is low, this method is not suitable anymore because of the transformer capacitance. The transformer 102 exhibits a parasitic capacitance having two components, a parasitic capacitance between the high voltage winding 108 and the low voltage winding 106 and a parasitic capacitance between the high voltage winding 108 and ground 116. As shown, for example, in FIG. 7, the two components of the parasitic capacitance of the transformer 102 can be modeled by a high voltage to low voltage parasitic capacitor $C_{HV-LV}$ 118 (shown in phantom lines) and a high voltage to ground parasitic capacitor $C_{HV-GND}$ 120 (shown in phantom lines). As shown in phantom lines in FIG. 8, the high voltage to low voltage parasitic capacitor $C_{HV-LV}$ 118 and the high voltage to ground parasitic capacitor $C_{HV-GND}$ 120 can be modeled with a single equivalent parasitic capacitor $C_{EQU}$ 122 coupled between the hot node 114 of the high voltage winding 108 of the transformer 102 and ground 116. A parasitic current $I_{par}$ 124 flows through the equivalent parasitic capacitor $C_{EQU}$ 122 to ground 116. This additional current, parasitic current $I_{par}$ 124, is also flowing through the sense resistor $R_{sense}$ 110, but it is not a portion of the output current. As shown, for example in FIG. 8, the current flowing through the sense resistor $R_{sense}$ 110 is a current 128 represented by the combination of the output current 126 and the parasitic current 124 Consequently, the measured current does not represent the output current $I_{OUT}$ 126 accurately. If the waveform and amplitude are constant one could compensate for the current leakage by subtraction of an offset, but if this is not the case other techniques have to be used.

The described combination of factors is applicable for the high voltage power supply 100 required in many semi-conductive magnetic brush ("SCMB") printers. Thus the disclosed measurement circuit utilizes a simulation capacitor and a second sense resistor for measuring the current through the simulation capacitor. The simulation capacitor simulates the total equivalent parasitic capacitance and is connected directly with the hot side of the transformer's high voltage windings. The real output current can be obtained using this arrangement by subtracting the simulation capacitor current (measured with the second sense resistor) from the measured total current. In order to reduce additional transformer load because of the simulation capacitor, the capacitance can be scaled down. This can be corrected with scaling up the corresponding sense resistor value.

According to one aspect of the disclosure, a current measurement circuit for measuring the output of a power supply having a signal generator inputting a signal to an input winding of a transformer exhibiting a parasitic capacitance capable of being modeled by an equivalent parasitic capacitor coupled between a hot terminal of an output winding of the transformer and ground is provided. The current measurement circuit comprises a simulation capacitor, a second sense resistor, a first sense resistor and a differential amplifier. The simulation capacitor has a capacitance proportional to the parasitic capacitance of the transformer. The simulation capacitor has a first electrode coupled to the hot terminal of the output winding of the transformer and a second electrode coupled to a first node. The second sense resistor is coupled to the first node and to ground so that the current flowing through the simulation capacitor flows through the second sense resistor. The first sense resistor is coupled to a second node through which a current having a component representative of the output current of the power supply and a component representative of the parasitic current flows. The differential amplifier is coupled at an inverting input to the first node and at a non-inverting input to the second node. The differential amplifier supplies an output signal proportional to the output current of the power supply.

According to a second aspect of the disclosure, a printer apparatus includes a photoreceptor, a magnetic roll, an electrode, a current source and a current measurement circuit. The magnetic roll is configured to attract development material including toner to a development zone adjacent the photoreceptor. The electrode is positioned adjacent the development zone and configured to induce toner transported by the magnetic roll to be released in the development zone by generating a magnetic field induced by a current flowing through the electrode. The current source is coupled to the electrode and supplies a current thereto for generating the magnetic field. The current source has a signal generator inputting a signal to an input winding of a transformer exhibiting a parasitic capacitance capable of being modeled by an equivalent parasitic capacitor coupled between a hot terminal of an output winding of the transformer and ground. The current measurement circuit comprises a simulation capacitor, a first sense resistor, a second sense resistor and a differential amplifier. The simulation capacitor has a capacitance proportional to the parasitic capacitance of the transformer. The simulation capacitor has a first electrode coupled to the hot terminal of the output winding of the transformer and a second electrode coupled to a first node. The second sense resistor is coupled to the first node and to ground so that the current flowing through the simulation capacitor flows through the second sense resistor. The first sense resistor is coupled to a second node through which a current having a component representative of the output current of the current source and a component representative of the parasitic current flows. The differential amplifier is coupled at an inverting input to the first node and at a non-inverting input to the second node. The differential amplifier supplies an output signal proportional to the output current of the current source.

According to yet another aspect of the disclosure, a method of measuring the current output by a power supply having a transformer exhibiting a parasitic capacitance capable of being modeled by an equivalent parasitic capacitor coupled to a hot terminal of an output winding of the transformer and ground through which a parasitic current flows when the output of the transformer is a high voltage low current signal having high frequency components is provided. The method comprises measuring a current including a component proportional to the output current of the power supply and a component proportional to the parasitic current and subtracting the component proportional to the parasitic current from the measured current.

Additional features and advantages of the presently disclosed current measurement circuit for a transformer with high frequency output will become apparent to those skilled in the art upon consideration of the following detailed description of embodiments exemplifying the best mode of carrying out the disclosed method and apparatus as presently perceived.

BRIEF DESCRIPTION OF THE DRAWINGS

A more complete understanding of the disclosed apparatus can be obtained by reference to the accompanying drawings wherein.

Corresponding reference characters indicate corresponding parts throughout the several views. Like reference characters tend to indicate like parts throughout the several views.

DETAILED DESCRIPTION

Figure 1:
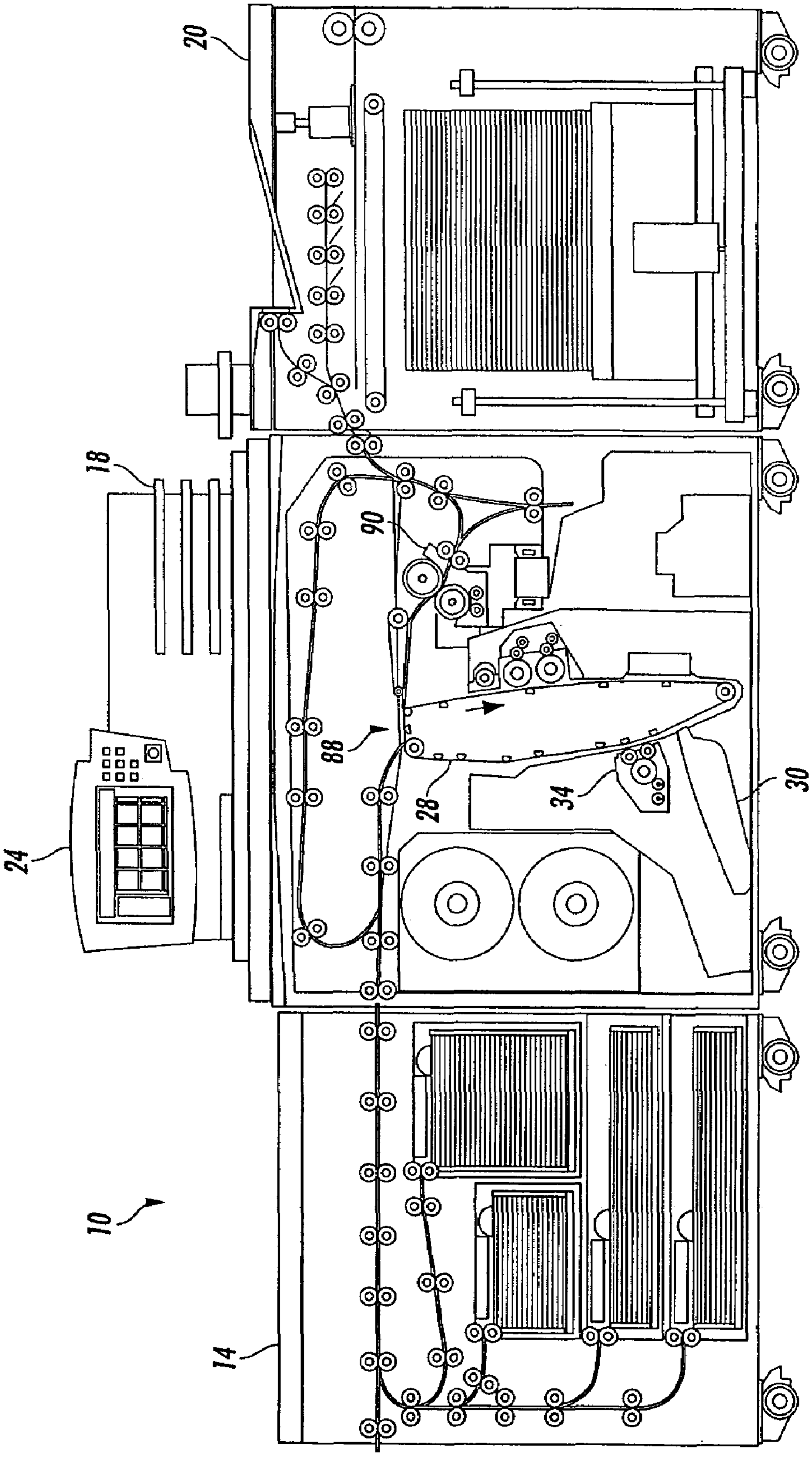
FIG. 1 is an elevational view of an electrostatographic printing apparatus incorporating a semiconductive magnetic brush ("SCMB") development system having two magnetic rolls.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

FIG. 1 is an elevational view of an electrostatographic printing apparatus 10, such as a printer or copier, having a development subsystem that uses two magnetic rolls 36, 38 for developing toner particles that are carried on semiconductive carrier particles. The machine 10 includes a feeder unit 14, a printing unit 18, and an output unit 20. The feeder unit 14 houses supplies of media sheets and substrates onto which document images are transferred by the printing unit 18. Sheets to which images have been fixed are delivered to the output unit 20 for correlating and/or stacking in trays for pickup.

The printing unit 18 includes an operator console 24 where job tickets may be reviewed and/or modified for print jobs performed by the machine 10. The pages to be printed during a print job may be scanned by the printing machine 10 or received over an electrical communication link. The page images are used to generate bit data that are provided to a raster output scanner (ROS) 30 for forming a latent image on the photoreceptor 28. Photoreceptor 28 continuously travels the circuit depicted in the figure in the direction indicated by the arrow. The development subsystem 34 develops toner on the photoreceptor 28. At the transfer station 88, the toner conforming to the latent image is transferred to the substrate by electric fields generated by the transfer station. The substrate bearing the toner image travels to the fuser station 90 where the toner image is fixed to the substrate. The substrate is then carried to the output unit 20. This description is provided to generally describe the environment in which a current measurement circuit for a transformer having a high frequency output may be used and is not intended to limit the use of such a current measurement circuit to this particular printing machine environment.

Figure 2:
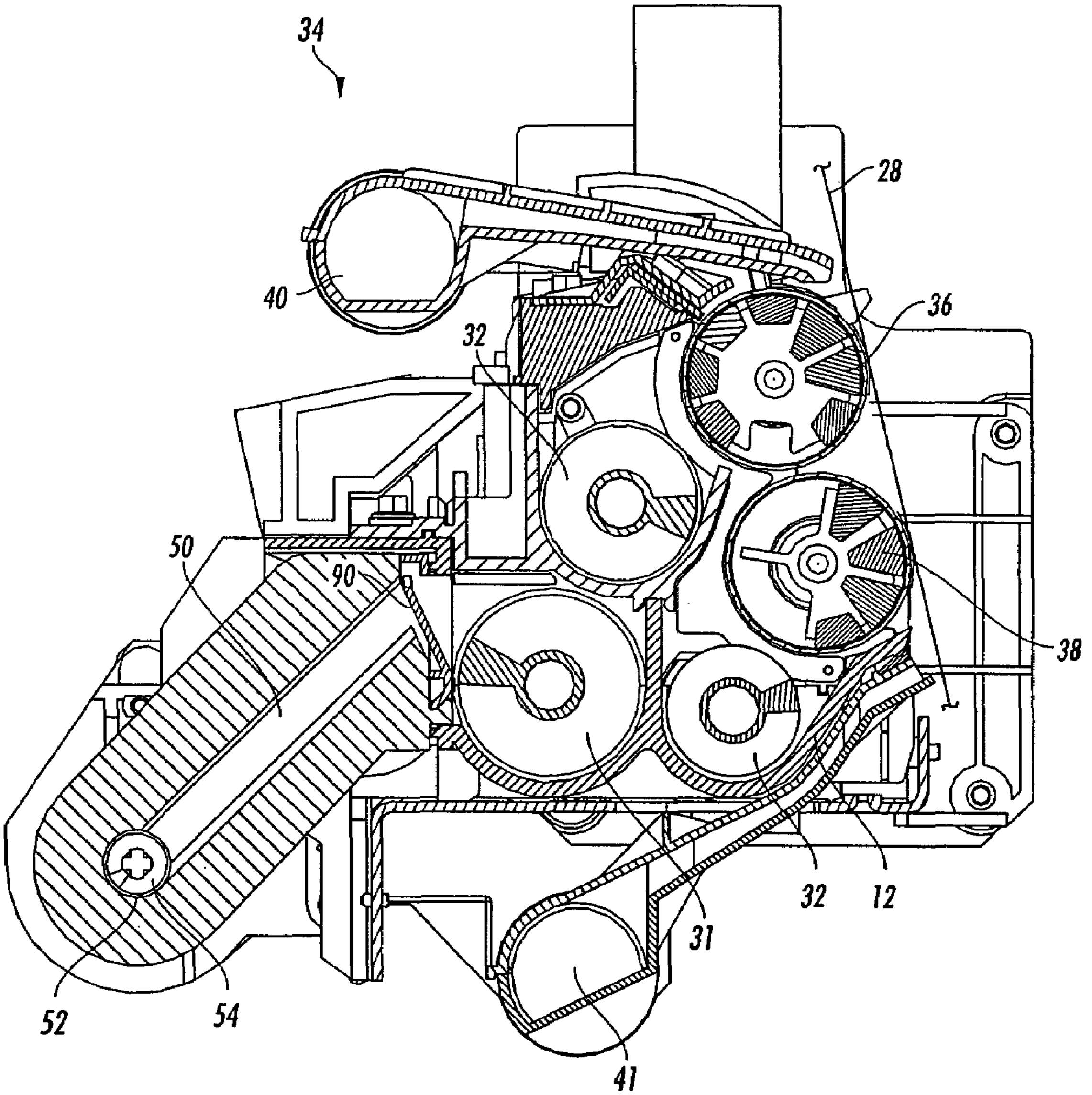
FIG. 2 is a sectional view of a SCMB developer unit having two magnetic rolls.

The overall function of developer unit 34, which is shown in FIG. 2, is to apply marking material, such as toner, onto suitably-charged areas forming a latent image on an image receptor such as the photoreceptor 28, in a manner generally known in the art. The developer unit 34 provides a longer development zone while maintaining an adequate supply of developer having semiconductive carrier particles than many known development systems. Nevertheless, the disclosed current measurement circuit can be utilized with other developer units within the scope of the disclosure. In various types of printers, there may be multiple such developer units, such as one for each primary color or other purpose.

Among the elements of the developer unit 34, which is shown in FIG. 2, are a housing 12, which functions generally to hold a supply of developer material having semiconductive carrier particles, as well as augers, such as 31, 32, 33, which variously mix and convey the developer material, and magnetic rolls 36, 38, which in this embodiment form magnetic brushes to apply developer material to the photoreceptor 28. Other types of features for development of latent images, such as donor rolls, paddles, scavengeless-development electrodes, commutators, etc., are known in the art and may be used in conjunction with various embodiments pursuant to the claims. In the illustrated embodiment, there is further provided air manifolds 40, 41, attached to vacuum sources (not shown) for removing dirt and excess particles from the transfer zone near photoreceptor 28. As mentioned above, a two-component developer material is comprised of toner and carrier. The carrier particles in a two-component developer are generally not applied to the photoreceptor 28, but rather remain circulating within the housing 12.

Figure 3:
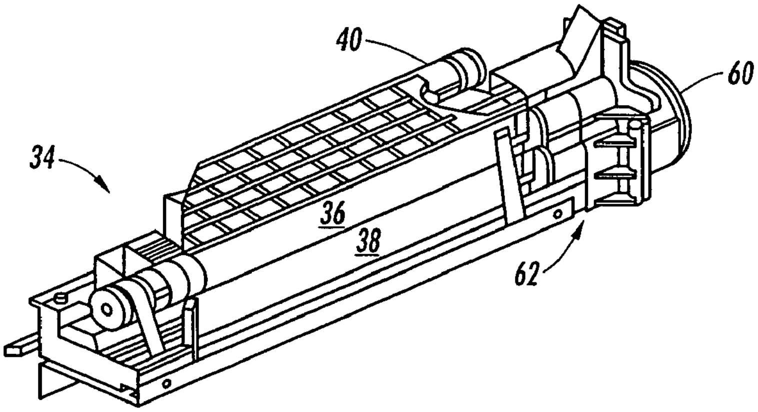
FIG. 3 is a perspective view of a SCMB developer unit having two magnetic rolls.

FIG. 3 is a perspective view of a portion of developer unit 34. As can be seen in this embodiment, the upper magnetic roll 36 and the lower magnetic roll 38 form a development zone that is approximately as long as the two diameters of the magnetic rolls 36 and 38. As further can be seen, a motor 60 is used with a mechanism, generally indicated with reference numeral 62, to cause rotation of the various augers, magnetic rolls, and any other rotatable members within the developer unit 34 at various relative velocities. There may be provided any number of such motors. The illustrated magnetic rolls 36 and 38 are rotated in a direction that is opposite to the direction in which the photoreceptor moves past the developer unit 34. That is, the two magnetic rolls are operated in the against mode for development of toner. However the disclosed circuit for measuring the output current of a transformer can be utilized with magnetic rolls operating in the with mode as well.

Figure 4:
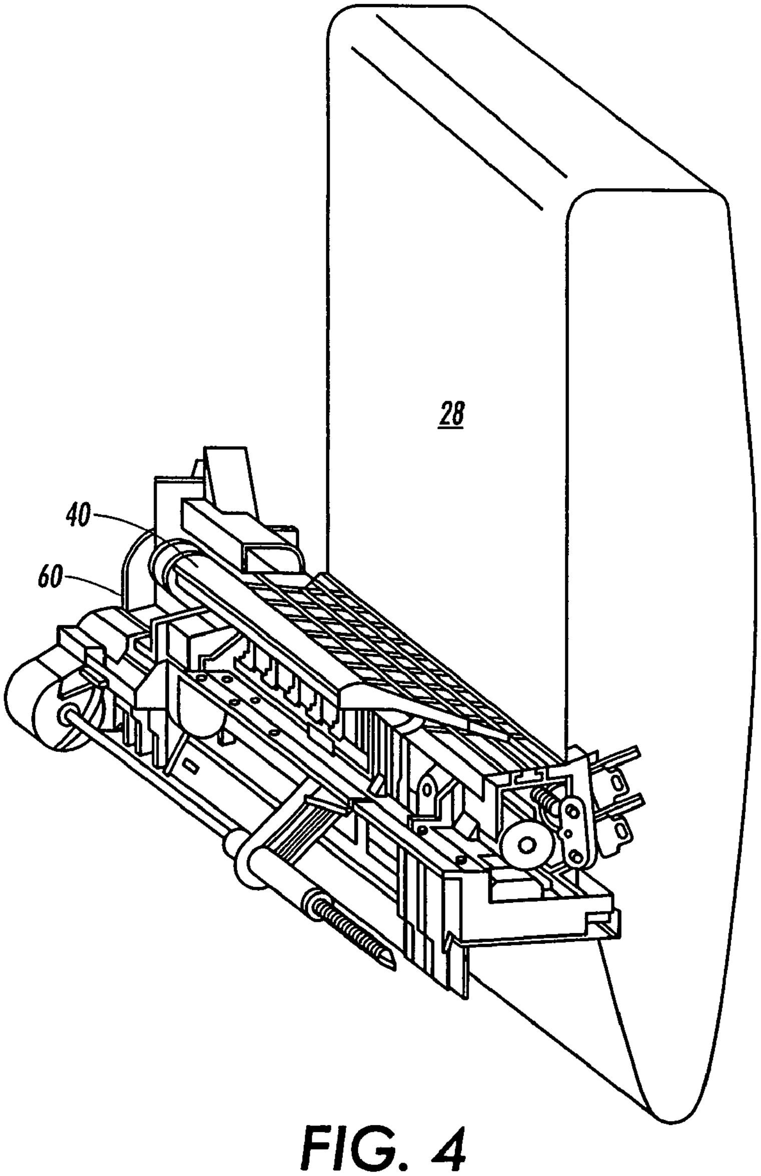
FIG. 4 is a perspective view of a SCMB developer unit showing the relationship of the two magnetic rolls to the path of the photoreceptor bearing a latent image.

FIG. 4 shows the relationship of the photoreceptor 28 to the developer unit 34 within a printing machine, such as the machine 10 shown in FIG. 1. In this arrangement, the lower magnetic roll 38 develops approximately 30% of the toner that is developed in the development zone of the developer unit 34 and the upper magnetic roll 36 develops approximately 70% of the toner. The lower roll 38 also acts to cleanup the carrier particles from the development zone. The two magnetic roll arrangement operating in the against mode is able to develop toner carried by semiconductive carrier particles while maintaining fine line and edge development at speeds from 100 to 200 ppm.

As is well known, magnetic rolls, such as magnetic rolls 36 and 38, are comprised of a rotating sleeve and a stationary core in which rare earth magnets are housed. The magnetic field generated by the magnets causes toner and carrier particles to be attracted to the magnetic rolls 36 and 38. As shown, for example, in FIG. 5, a pair of electrode wires 42 is located in the development zone between magnetic roll 36 and the photoreceptor 28 and a pair of electrode wires 44 is located in the development zone between the magnetic roll 38 and the photoreceptor 28. An electrical bias is applied by a power source 100 to the electrode wires 42, 44. The bias establishes an electrostatic field between the wires 42, 44 and the magnetic rolls 36, 38, respectively, which is effective in detaching toner from the surface of the magnetic rolls 36 and 38 and forming a toner cloud about the wires 42, 44. In high speed printers, the electrostatic field needs to be varied at a high rate of speed to cause the formation of a toner cloud at the appropriate moment for toner to be attracted to the photoreceptor 28. Thus the power supply 100 generates a high frequency current. The high frequency current is generally generated by a high voltage transformer 102 coupled to a square wave generator 104 at its low voltage or input winding 106 and generating a stepped up high frequency current at its high voltage or output winding 108.

As mentioned above, prior art sensing circuits that measure the voltage drop across a single sense resistor $R_{sense}$ 110 do not accurately reflect the output current $I_{out}$ 126 of the power supply 100 when a high voltage high frequency and low current output is generated. This is because the current 128 flowing through the sense resistor $R_{sense}$ 110 includes a component attributable to the parasitic current $I_{par}$ 124 as a result of the parasitic capacitance of the transformer 102. The high voltage power supply 100 required in many SCMB printers occasionally generates a high voltage, high frequency low current output. Thus the disclosed measurement circuit 200 comprises a simulation capacitor 202, a sense resistor $R_{sense}$ 210, a second sense resistor $(a+1)R_{sense}$ 204 and a differential amplifier 206, as shown, for example, in FIG. 6. The second sense resistor $(a+1)R_{sense}$ 204 is utilized for measuring the current through the simulation capacitor 202. The simulation capacitor 202 simulates the total equivalent parasitic capacitance (shown in phantom lines as equivalent parasitic capacitor $C_{EQU}$ 122) and is connected directly with the hot terminal 114 of the high voltage winding 108 of the transformer 102. The simulation capacitor 202 is coupled through the second sense resistor $(a+1)R_{sense}$ 204 to ground 116. The real output current $I_{OUT}$ 126 can be obtained using this arrangement subtracting the simulation capacitor current $I_{par}/a$ 208 (measured with the second sense resistor) from the measured total current 212 across the sense resistor 210. In order to reduce additional transformer load because of the simulation capacitor 202, the factor a can be used to scale down the capacitance of simulation capacitor 202, as compared to the equivalent parasitic capacitance $C_{EQU}$ 122. This can be corrected with scaling up the corresponding resistance of the second sense resistor 204.

Figure 7:
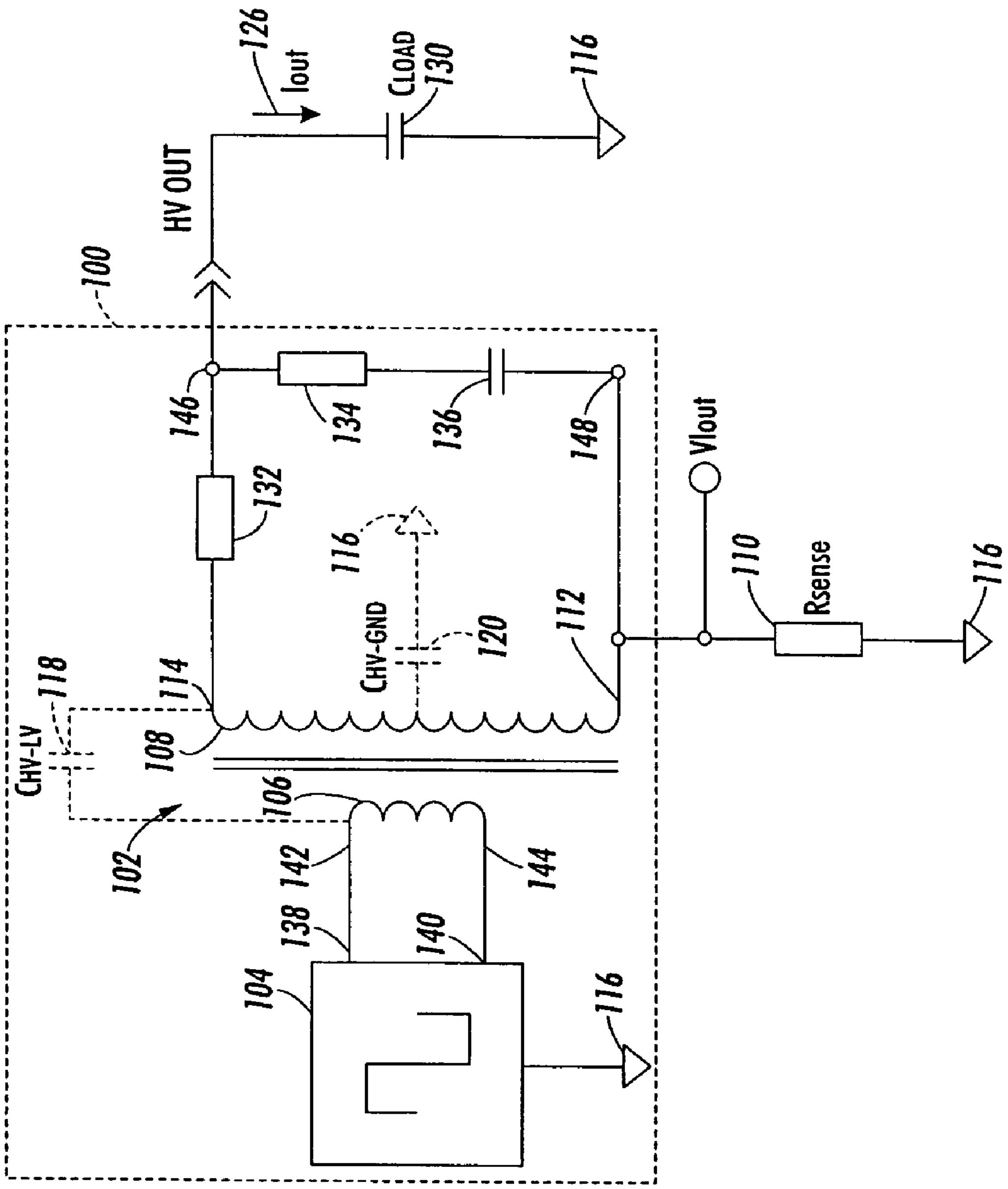
FIG. 7 is a schematic diagram of a power supply and a prior art circuit utilized to measure the output current of a transformer of the power supply showing capacitors in phantom lines that represent the parasitic capacitance of the transformer generated when a high voltage high frequency current is received at the input; and, FIG. 8 is a schematic diagram of an equivalent circuit of the prior art power supply and circuit utilized to measure the output current of the transformer of the power supply of FIG. 7 showing a single equivalent capacitor in phantom lines that represents the parasitic capacitance of the transformer generated when a high voltage high frequency current is received at the input.
Figure 8:
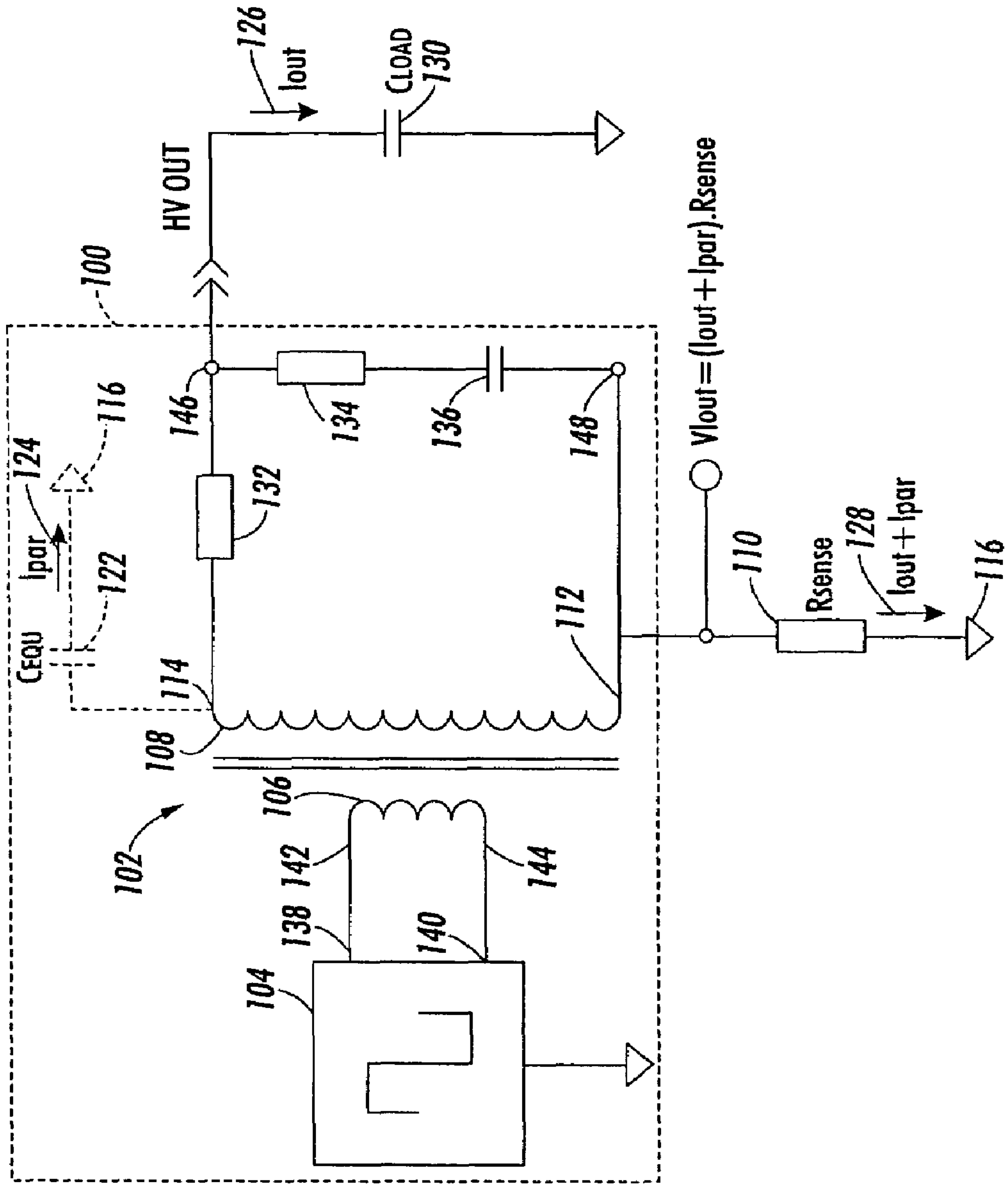

As mentioned previously, parasitic capacitance of high voltage transformers 102 causes problems with measuring the output current $I_{OUT}$ 126 when the waveform has high frequency components, the output voltage is high and the output current $I_{OUT}$ 126 is low. The parasitic capacitance is modeled with a capacitor 118 between the high voltage winding 108 and the low voltage winding 106 and a capacitor 120 from the high voltage winding 108 to ground 116 as shown, for example, in FIG. 7. In FIGS. 7 and 8 the prior art method for measuring the output current $I_{OUT}$ 126 is shown. In the prior art, the output current $I_{OUT}$ 126 of a high voltage transformer 102 is measured using a sense resistor 110 coupled between the hot terminal 114 of the output winding 108 of the transformer 102 and ground 116. The voltage $V_{OUT}$ is measured across the sense resistor 110 and using Ohm's law, the current 128 across the resistor $R_{sense}$ 110 is calculated using the known resistance of the sense resistor 110. The current $I_{Rout}$ 128 across the resistor $R_{sense}$ 110 is proportional to the output current $I_{out}$ 126 of the transformer 102 for low frequency inputs. This method is effective for low frequencies but is not effective for high frequency, high voltage low current outputs.

As shown, for example, in FIGS. 5–8, the current source 100 for the electrode wires 42, 44 (represented generally as a capacitive load 130) utilized to remove toner from the magnetic rolls 36, 38 of a printer 10 typically includes a square wave generator 104, a ferrite core high voltage transformer 102, and resistors 132, 134 and a capacitor 136 serving as snubbering and wave shaping components. In such an arrangement, the parasitic capacitance of the transformer 102 can be modeled with a capacitance across the high voltage and low voltage windings of the transformer (shown as a capacitor $C_{HV\text{-}LV}$118 in phantom lines in FIG. 7 and a capacitance between the high voltage winding and ground (shown as a capacitor $C_{HV\text{-}GND}$ 120 in phantom lines in FIG. 7). When the square wave generator 104 produces a high frequency input signal to the transformer 102, the high frequency components of the square wave cause currents to flow through $C_{HV\text{-}LV}$ 118 and $C_{HV\text{-}GND}$ 120.

Figure 6:
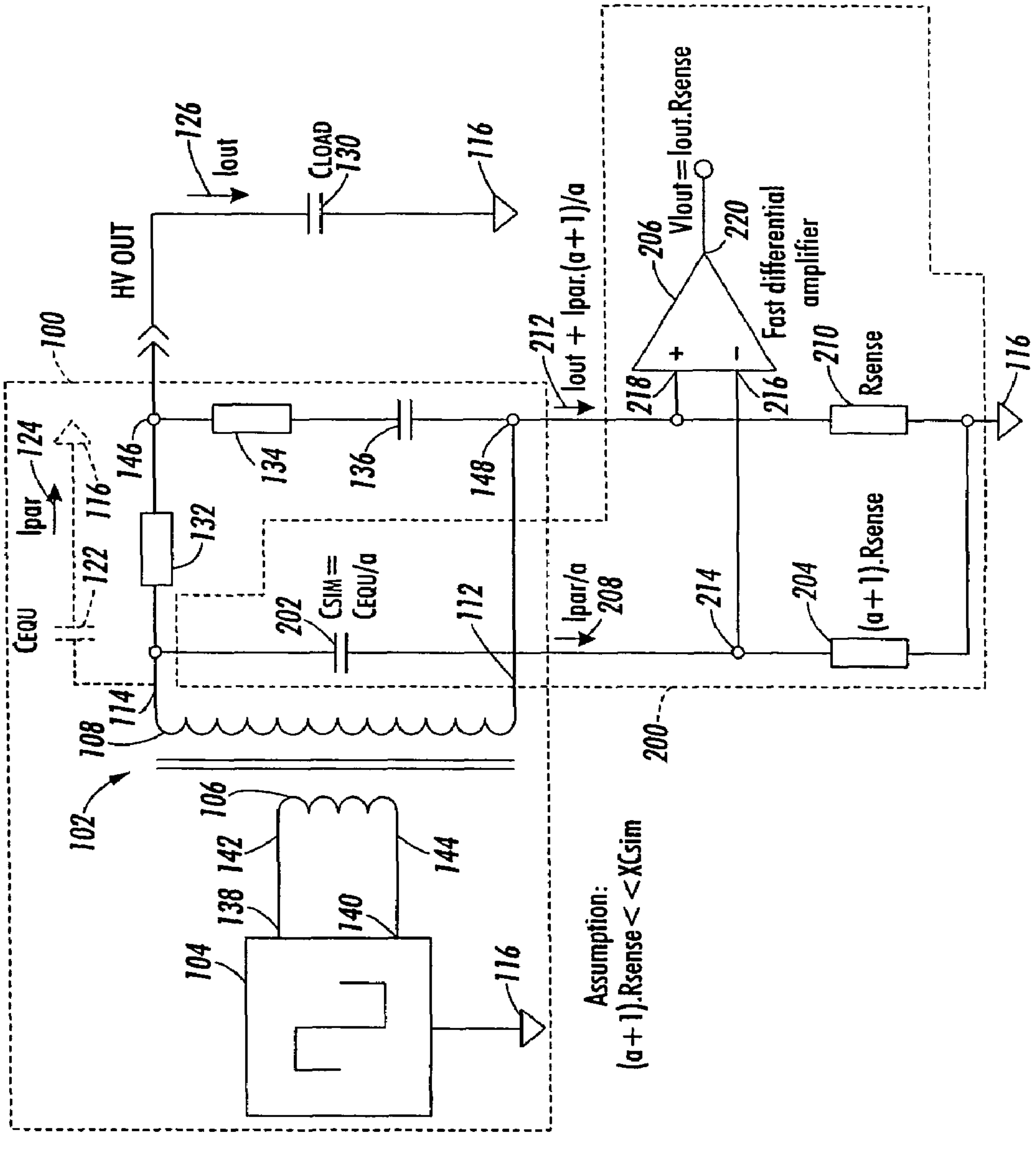
FIG. 6 is a schematic view of a circuit utilized to supply the SCMB developer unit of FIGS. 2–5 with a high voltage high frequency current and components utilized to measure the output current of the circuit.

As shown, for example, in FIGS. 6 and 7, the $C_{HV\text{-}LV}$ 118 and $C_{HV\text{-}GND}$ 120 components of the parasitic capacitance generated by the transformer 102 when subjected to high frequency input can be modeled with a single equivalent capacitor $C_{EQU}$ 122 (shown in phantom lines in FIGS. 6 and 8). The current $I_{par}$ 124 flowing through the equivalent parasitic capacitor $C_{EQU}$ 122 is called a parasitic current. As shown, for example, in FIG. 8, when a parasitic current $I_{par}$ 124 is present, the current 128 across the sense resistor $R_{sense}$ 110 includes not only the output current $I_{OUT}$ 126 of the transformer 102 but also a component proportional to the parasitic current $I_{par}$ 124. Thus, applying Ohm's law to the voltage measure across the sense resistor $R_{sense}$ 110 will yield a current measurement that differs from the output current 126 of the transformer 102 by the value of the parasitic current 124.

The RMS value of the parasitic current 124 depends upon the construction of the transformer 102, the capacitive current from the transformer 102 to the surrounded space, the frequency of the square wave being input to the transformer 102, the rise and fall times of the square wave input and the amplitude of the square wave input. If one of these factors is variable, the value of the parasitic current $I_{par}$ 124 is variable as well. If the value of the parasitic current $I_{par}$ 124 is variable, it is not possible to obtain an accurate measurement of the output current $I_{OUT}$ 126 by simply subtracting an offset from the value of the current determined by applying Ohm's law to the voltage measure across the sense resistor $R_{sense}$ 110.

It is possible to minimize the parasitic capacitance of a transformer 102. One way to minimize parasitic resistance is to manufacture the transformer 102 in such a way that the equivalent parasitic resistance $C_{EQU}$ is very small. This involves special construction techniques that substantially increase the cost of the transformer 102 while failing to ever completely eliminate the equivalent parasitic resistance when a high frequency wave form is input into the transformer 102 and a low current signal is output.

Alternatively, the parasitic resistance component of the current measured can be eliminated by measuring the output current across a sense resistor placed in series with the high voltage output. This requires that extremely accurate high voltage resistors be utilized for voltage division or that a differential amplifier be utilized which accepts the high common mode voltages. These alternative techniques for measuring output voltage may not be acceptable because they create new accuracy concerns, are less reliable and/or cost more to implement.

Figure 5:
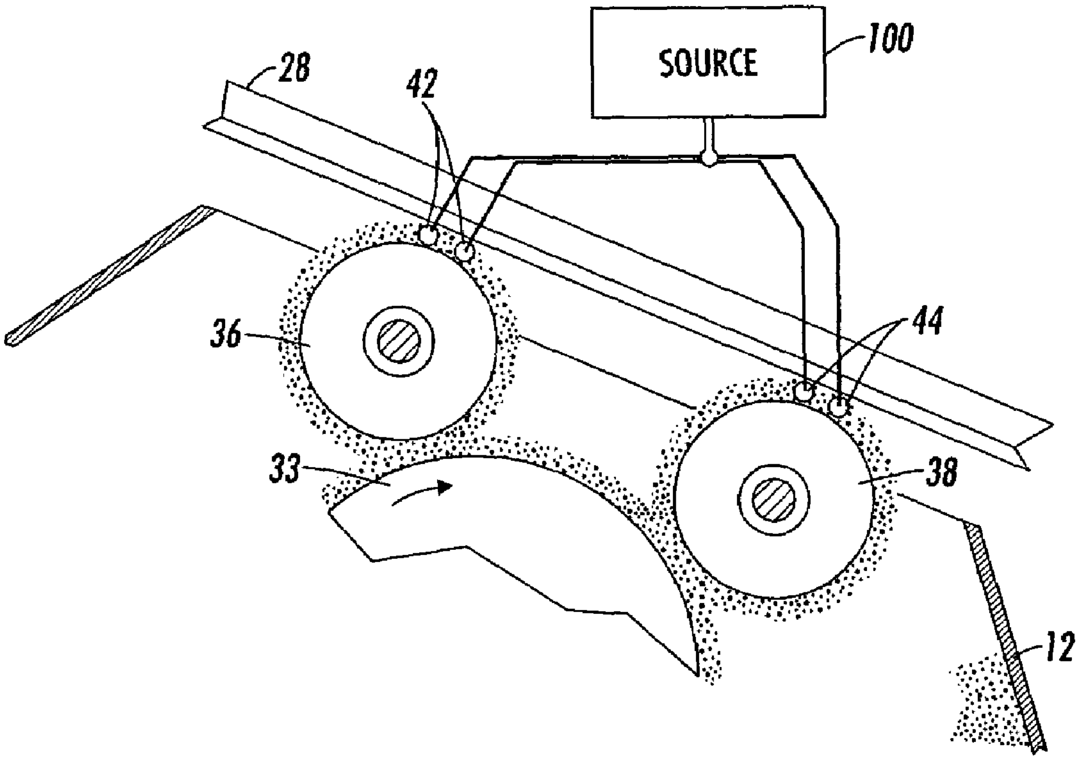
FIG. 5 is an elevational view of a development station of the printing apparatus of FIG. 1 showing the two magnetic rolls of developer unit of FIG. 2, wires adjacent each of the magnetic rolls in the area where toner is transferred to the photoreceptor and an AC power source for generating a cancellation magnetic field between the wires to induce toner on the magnetic rolls to be expelled therefrom to form a toner cloud.

Referring to FIGS. 5 and 6, there is shown a current source 100 for a capacitive load 130 of a printer 110 and a circuit 200 for measuring the output current $I_{OUT}$ 126 of the current source 100. As previously mentioned, the current source 100 includes an input signal generator, illustratively a square wave generator 104, a transformer 102, illustratively a ferrite core transformer having an input winding 106 and an output winding 108, and resistors 132, 134 and a capacitor 136 forming a snubbering and wave shaping circuit. The signal generator 104 includes two outputs 138, 140. One output 138 of the signal generator 104 is coupled to the hot terminal 142 of the input winding 106 of the transformer 102. The other output 140 of the signal generator 104 is coupled to the ground terminal 144 of the input winding 106 of the transformer 102. The output winding 108 of the transformer 102 includes a hot output 114 and a ground output 112. The hot output 114 is coupled to one electrode of a resistor 132 of the snubbering and wave shaping circuit. The other electrode of the resistor 132 is coupled to a node 146. The node 146 is coupled through an output to the input terminal of the capacitive load 130 which is coupled at its output terminal to ground 116. The node 146 is also coupled to one electrode of the other resistor 134 of the snubbering and wave shaping circuit. The other resistor 134 of the snubbering and wave shaping circuit is coupled in series with the capacitor 136 of the snubbering and wave shaping circuit to a node 148 coupled to the ground output 112 of the high voltage winding 108 of the transformer 102.

Shown in phantom lines is an equivalent parasitic capacitor $C_{EQU}$ 122 representing the parasitic capacitance of the transformer 102. The parasitic capacitor 122 is coupled between the hot output 114 of the high voltage winding 108 of the transformer 102 and ground 116. The parasitic current $I_{par}$ 124 flows through the parasitic capacitor $C_{EQU}$ 122 to ground 116.

As shown, in FIG. 6, the circuit 200 for measuring the output current 126 of the current source 100 includes the simulation capacitor 202 for simulating the parasitic capacitance of transformer 202, the second sense resistor (a+1) $\cdot R_{sense}$ 204, the first sense resistor $R_{sense}$ 210 and the differential amplifier 206. The positive electrode of the simulation capacitor 202 is coupled to the hot output 114 of the high voltage winding 108 of the transformer 102. The negative electrode of the simulation capacitor 202 is coupled to a node 214. The node 214 is coupled through the second sense resistor 204 to ground 116. The node 214 is also coupled to the inverting input 216 of the differential amplifier 206. The non-inverting input 218 of the differential amplifier 206 is coupled to node 148 of the power supply 100. The node 148 of the power supply 100 is coupled through the second sense resistor 210 to ground 116.

The simulation capacitor $C_{sim}$ 202 is selected to simulate the parasitic capacitance of the transformer 102. The capacitance of the simulation capacitor 202 is selected to be proportional to the equivalent parasitic capacitance represented by the equivalent parasitic capacitor $C_{EQU}$ 122. The proportionality factor is 1/a so that:

$$C_{SIM} = \frac{C_{EQU}}{a}$$

The proportionality factor is utilized to reduce the additional load placed on the transformer 102 by the simulated capacitor 202. Those skilled in the art will be able to easily select the value of the proportionality factor based on the parameters of the power supply circuit 100 and its associated transformer 102.

Those skilled in the art will recognize that the current 208 flowing through the simulation capacitor 202 is proportional to the parasitic current 124 flowing through the equivalent parasitic capacitor 122. The current 208 flowing through the simulation capacitor 202 is $I_{par}$/a. The current 208 flowing through the simulation capacitor 202 can be measured by applying Ohm's law to the voltage measurement taken across the second sense resistor 204. The second sense resistor 204 is selected to have a resistance that is greater than the resistance of the first sense resistor 210 by a factor of (a+1) so that RS2=(a+1)RS1

The current 212 flowing out of the node 148 of the power supply 100 includes an output current component $I_{OUT}$ and a component proportional to the parasitic current. Because of the resistance values of the first sense resistor 210 and the second sense resistor 202, the current flowing through the first sense resistor 210 is:

$$I_{Rsense} = I_{out} + I_{par}\left(\frac{a+1}{a}\right)$$

The differential amplifier 206 is utilized to subtract out the proportional parasitic current component Ipar(a+1)/a flowing through the first sense resistor 210 to provide at its output 220 a voltage equal to the resistance of the first sense resistor 210 times the output current $I_{OUT}$ 126 of the power supply 100. The voltage present at the non-inverting input 218 of the differential amplifier 206 is the voltage across the first sense resistor 210 and the voltage present at the inverting terminal 216 of the differential amplifier 206 is the voltage across the second sense resistor 204.

While the disclosed circuit 200 for measuring the output current of a power supply 100 has been represented as being utilized with a printer apparatus 10 having a power supply 100 that outputs a high frequency, high voltage, low current output, the measurement circuit 200 could be utilized with any power supply within the scope of the disclosure.

Although the disclosed current measurement circuit 200 has been described in detail with reference to a certain embodiment, variations and modifications exist within the scope and spirit of the present disclosure as described and defined in the following claims.

What is claimed is:

1. A printer apparatus comprising:

a photoreceptor;

a magnetic roll configured to attract development material including toner to a development zone adjacent the photoreceptor;

an electrode positioned adjacent the development zone and configured to induce toner transported by the magnetic roll to be released in the development zone by generating a magnetic field induced by a current flowing through the electrode;

a current source coupled to the electrode and supplying a current thereto for generating the magnetic field, the current source having a signal generator inputting a signal to an input winding of a transformer exhibiting a parasitic capacitance capable of being modeled by an equivalent parasitic capacitor coupled between a hot terminal of an output winding of the transformer and ground; and a current measurement circuit comprising:

a simulation capacitor having a capacitance proportional to the parasitic capacitance of the transformer, the simulation capacitor having a first electrode and a second electrode, the first electrode being coupled to the hot terminal of the output winding of the transformer and the second electrode being coupled to a first node;

a second sense resistor coupled to the first node and to ground so that the current flowing through the simulation capacitor flows through the second sense resistor;

a first sense resistor coupled to a second node through which a current having a component representative of the output current of the current source and a component representative of the parasitic current flows;

a differential amplifier coupled at an inverting input to the first node and at a non-inverting input to the second node;

whereby the differential amplifier supplies an output signal proportional to the output current of the current source.

2. The printer apparatus of claim 1 wherein the current source includes a snubbering and wave shaping circuit comprising a resistor and a capacitor coupled between the hot terminal of the output winding of the transformer and the second node.

3. The printer apparatus of claim 1 wherein the capacitance of the simulation capacitor is related to the parasitic capacitance of the transformer by a factor.

4. The printer apparatus of claim 3 wherein the factor is 1/a.

5. The printer apparatus of claim 4 wherein the resistance of the second sense resistor is (a+1) times the resistance of the first sense resistor.

6. The printer apparatus of claim 4 wherein the signal present on the output of the differential amplifier is a voltage proportional to the output current of the current source times the resistance of the first sense resistor.

7. The printer apparatus of claim 6 wherein the signal present on the output of the differential amplifier is a voltage equal to the output current of the current source times the resistance of the first sense resistor.

* * * * *

UNITED STATES PATENT AND TRADEMARK OFFICE

CERTIFICATE OF CORRECTION

PATENT NO. : 7,197,268 B2 Page 1 of 1
APPLICATION NO. : 11/174119
DATED : March 27, 2007
INVENTOR(S) : Hendrikus A. Verheijen It is certified that error appears in the above-identified patent and that said Letters Patent is hereby corrected as shown below:

In the Detailed Description:

Column 9, Line 66: Replace “second” with --first--.

Signed and Sealed this

Nineteenth Day of February, 2008

JON W. DUDAS
*Director of the United States Patent and Trademark Office*